United States Patent
Kang et al.

(10) Patent No.: US 7,126,185 B2
(45) Date of Patent: Oct. 24, 2006

(54) CHARGE TRAP INSULATOR MEMORY DEVICE

(75) Inventors: Hee Bok Kang, Daejeongwangyeok-si (KR); Jin Hong Ahn, Gyeonggi-do (KR); Jae Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 3 days.

(21) Appl. No.: 11/115,135

(22) Filed: Apr. 27, 2005

(65) Prior Publication Data

US 2006/0138521 A1    Jun. 29, 2006

(30) Foreign Application Priority Data

Dec. 29, 2004  (KR)  ............. 10-2004-0115423
Dec. 29, 2004  (KR)  ............. 10-2004-0115425

(51) Int. Cl.
  *H01L 29/788*  (2006.01)
(52) U.S. Cl. .............. 257/316; 257/318; 257/319; 257/320; 257/324; 257/347
(58) Field of Classification Search ......... 257/315, 257/316, 318–321, 324, 347
  See application file for complete search history.

(56) References Cited

U.S. PATENT DOCUMENTS

| | | | |
|---|---|---|---|
| 5,446,299 A | 8/1995 | Acovic et al. | |
| 5,471,417 A | 11/1995 | Krautschneider et al. | |
| 5,780,886 A | 7/1998 | Yamanobe | |
| 5,955,774 A | 9/1999 | Kang | |
| 6,211,005 B1 | 4/2001 | Kang | |
| 6,469,334 B1 | 10/2002 | Arita et al. | |
| 6,525,379 B1* | 2/2003 | Nomoto et al. | ............. 257/347 |
| 6,538,916 B1 | 3/2003 | Ohsawa | |
| 6,614,066 B1 | 9/2003 | Stengl et al. | |
| 6,617,629 B1 | 9/2003 | Drab et al. | |
| 6,784,473 B1 | 8/2004 | Sakai et al. | |
| 2004/0041206 A1 | 3/2004 | Bhattacharyya | |

FOREIGN PATENT DOCUMENTS

| | | |
|---|---|---|
| JP | 2-140973 | 5/1990 |
| JP | 3-108192 | 5/1991 |

* cited by examiner

*Primary Examiner*—Thien F. Tran
(74) *Attorney, Agent, or Firm*—Heller Ehrman.LLP

(57) ABSTRACT

A charge trap insulator memory device comprises a plurality of memory cells connected serially, a first switching device, and a second switching device. In the plurality of memory cells, data applied through a bit line depending on potentials applied to a top word line and a bottom word line are stored in a charge trap insulator or the data stored in the charge trap insulator are outputted to the bit line. The first switching element selectively connects the plurality of memory cells to the bit line in response to a first selecting signal. The second switching element selectively connects the plurality of memory cells to a sensing line in response to a second selecting signal.

26 Claims, 19 Drawing Sheets

CHARGE TRAP INSULATOR MEMORY DEVICE

BACKGROUND OF THE INVENTION

1. Field of the Invention

The present invention generally relates to a charge trap insulator memory device, and more specifically, to a nano scale charge trap insulator memory device having an improved retention characteristic and cell integrated capacity obtained by depositing a plurality of charge trap insulator cell arrays vertically with a plurality of cell insulating layers.

2. Description of the Related Art

FIG. 1 is a cross-sectional diagram illustrating a memory cell of a conventional charge trap insulator memory device.

A memory cell of the conventional charge trap insulator memory device comprises a N-type drain region 4 and a N-type source region 6 which are formed in a P-type substrate 2, a first insulating layer 8, a charge trap insulator 10, a second insulating layer 12 and a word line 14 which are sequentially formed on the channel region.

In the above-described memory cell of the conventional charge trap insulator memory device, a channel resistance of the memory cell is differentiated by a state of charges stored in the charge trap insulator 10.

That is, since positive channel charges are induced to the channel when electrons are stored in the charge trap insulator 10, the memory cell becomes at a high resistance state to be turned off.

Meanwhile, negative channel charges are induced to the channel when positive holes are stored in the charge trap insulator 10, so that the memory cell becomes at a low resistance state to be turned on.

In this way, data are written in the memory cell by selecting kinds of charges of the charge trap insulator 10, so that the memory cell can be operated as a nonvolatile memory cell.

However, since the retention characteristic is degraded when the size of the memory cell of the conventional charge trap insulator memory device becomes smaller, it is difficult to perform a normal operation.

Specifically, since the retention characteristic of the memory cell having a charge trap insulator structure of a nano scale level becomes weaker even in a low voltage stress, a random voltage cannot be applied to a word line in a read mode.

SUMMARY OF THE INVENTION

Accordingly, it is an object of the present invention to operate a memory cell having a charge trap insulator structure of a nano scale level in a low voltage.

It is another object of the present invention to improve cell integrated capacity by depositing a plurality of charge trap insulator cell arrays vertically with a plurality of cell insulating layers.

In an embodiment, a charge trap insulator memory device comprises a plurality of memory cells connected serially, a first switching element, and a second switching element. In the plurality of memory cells, data applied through a bit line depending on potentials applied to a top word line and a bottom word line are stored in a charge trap insulator or the data stored in the charge trap insulator are outputted to the bit line. The first switching element selectively connects the plurality of memory cells to the bit line in response to a first selecting signal. The second switching element selectively connects the plurality of memory cells to a sensing line in response to a second selecting signal. Here, each of the plurality of memory cells comprises a first insulating layer formed on the bottom word line, a P-type float channel, a P-type drain region and a P-type source region formed at both sides of the P-type float channel, a second insulating layer formed on the P-type float channel, the charge trap insulator formed on the second insulating layer, and a third insulating layer formed on the charge trap insulator and under the top word line. Resistance of the P-type float channel formed on the first insulating layer is changed depending on the polarity of the charge trap insulator.

In another embodiment, a charge trap insulator memory device comprises a plurality of top word lines and a plurality of bottom word lines arranged in parallel to each other and in a row direction, a plurality of bit lines arranged in a column direction, a plurality of sensing lines arranged perpendicular to the plurality of bit lines, a plurality of memory cell arrays arranged where the plurality of top word lines, the plurality of bottom word lines and the plurality of bit lines are crossed, and a plurality of sense amplifiers which correspond one by one to the plurality of bit lines, sense and amplify data in the bit line. Here, each of the plurality of memory cell arrays comprises a plurality of serially connected memory cells, a first switching element, and a second switching element. In the plurality of serially connected memory cells, data applied through a bit line are stored in a charge trap insulator depending on potentials applied to an top word line and a bottom word line or data stored in the charge trap insulator are outputted to the bit line. The first switching element selectively connects the plurality of memory cells to a bit line in response to a first selecting signal. The second switching element selectively connects the plurality of memory cells to a sensing line in response to a second selecting signal. Here, each of the plurality of memory cells comprises a first insulating layer formed on the bottom word line, a P-type float channel, a P-type drain region and a P-type source region formed at both sides of the P-type float channel, a second insulating layer formed on the P-type float channel, the charge trap insulator formed on the second insulating layer, and a third insulating layer formed on the charge trap insulator and under the top word line. Resistance of the P-type float channel formed on the first insulating layer is changed depending on the polarity of the charge trap insulator.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
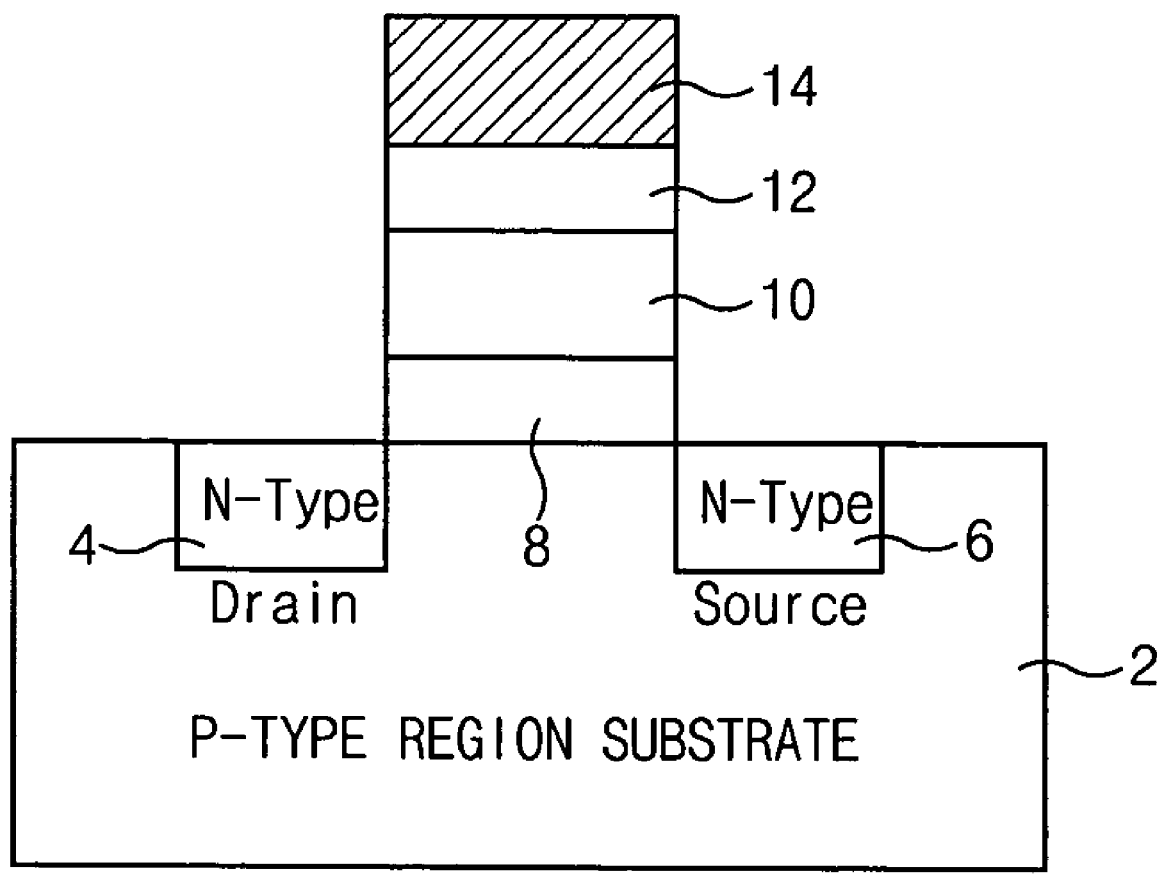
FIG. 1 is a cross-sectional diagram illustrating a memory cell of a conventional charge trap insulator memory device.
Figure 2A:
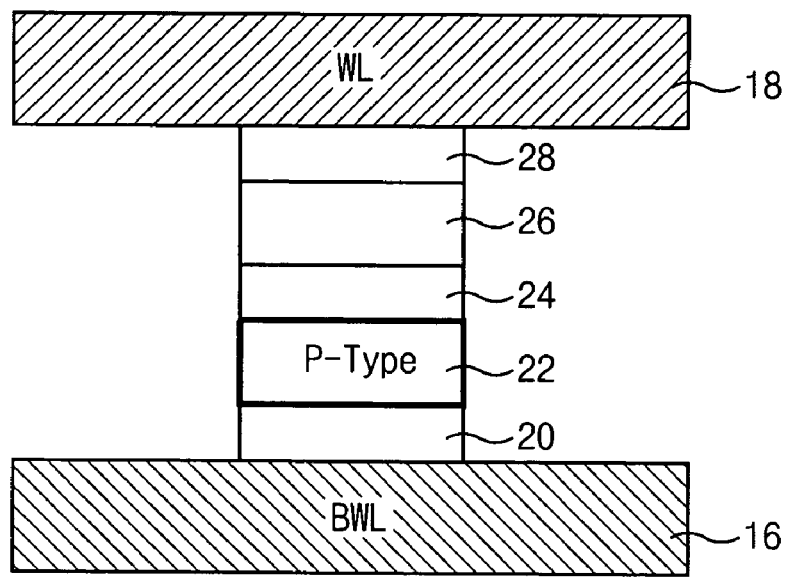
FIGS. 2a and 2b are cross-sectional diagrams illustrating a unit memory cell of a charge trap insulator memory device according to an embodiment of the present invention.

FIG. 2a is a cross-sectional diagram illustrating a unit memory cell cut in a direction parallel with a word line in a charge trap insulator memory device according to an embodiment of the present invention.

In the unit memory cell, a bottom word line 16 is formed in the bottom layer, and a top word line 18 is formed in the top layer. The bottom word line 16 is arranged in parallel with the top word line 18, and driven by the same row address decoder.

A first insulating layer 20, a float channel 22, a second insulating layer 24, a charge trap insulator 26 and a third insulating layer 28 are sequentially formed on the bottom word line 16. Here, the float channel 22 is formed with a P-type semiconductor.

Figure 2B:
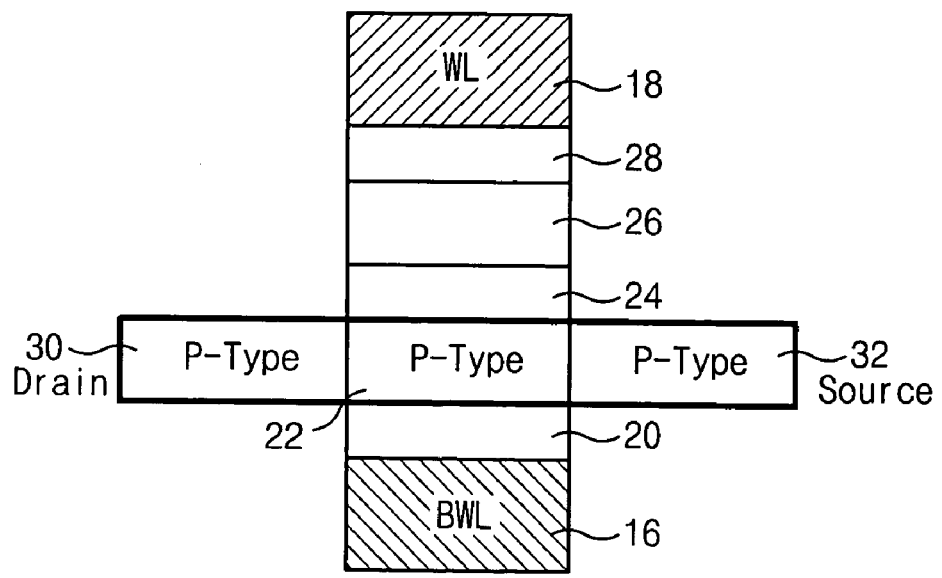

FIG. 2b is a cross-sectional diagram illustrating the unit memory cell cut in a direction perpendicular to the word line in the charge trap insulator memory device according to an embodiment of the present invention.

In the unit memory cell, the bottom word line 16 is formed in the bottom layer, and the top word line 18 is formed in the top layer. The bottom word line 16 is arranged in parallel with the top word line 18.

The first insulating layer 20, the float channel 22, the second insulating layer 24, the charge trap insulator 26 and the third insulating layer 28 are sequentially formed on the bottom word line 16. Here, a P-type drain 30 and a P-type source 32 are formed at both sides of the float channel 22.

The float channel 22, the P-type drain 30 and the P-type source 32 are formed of at least one of carbon nano tube, silicon, Ge, organic semiconductors and other materials.

A channel resistance of the unit memory cell of the charge trap insulator memory device is changed depending on a state of charges stored in the charge trap insulator 26.

In other words, since positive channel charges are induced to the channel of the memory cell when electrons are stored in the charge trap insulator 26, the memory cell is turned off at a high resistance channel state.

Meanwhile, since negative charges are induced to the channel when positive holes are stored in the charge trap insulator 26, the memory cell is turned on at a low resistance channel state.

In this way, data are written by selecting kinds of charges of the charge trap insulator 26, so that the memory cell can be operated as a nonvolatile memory cell.

Figure 2C:
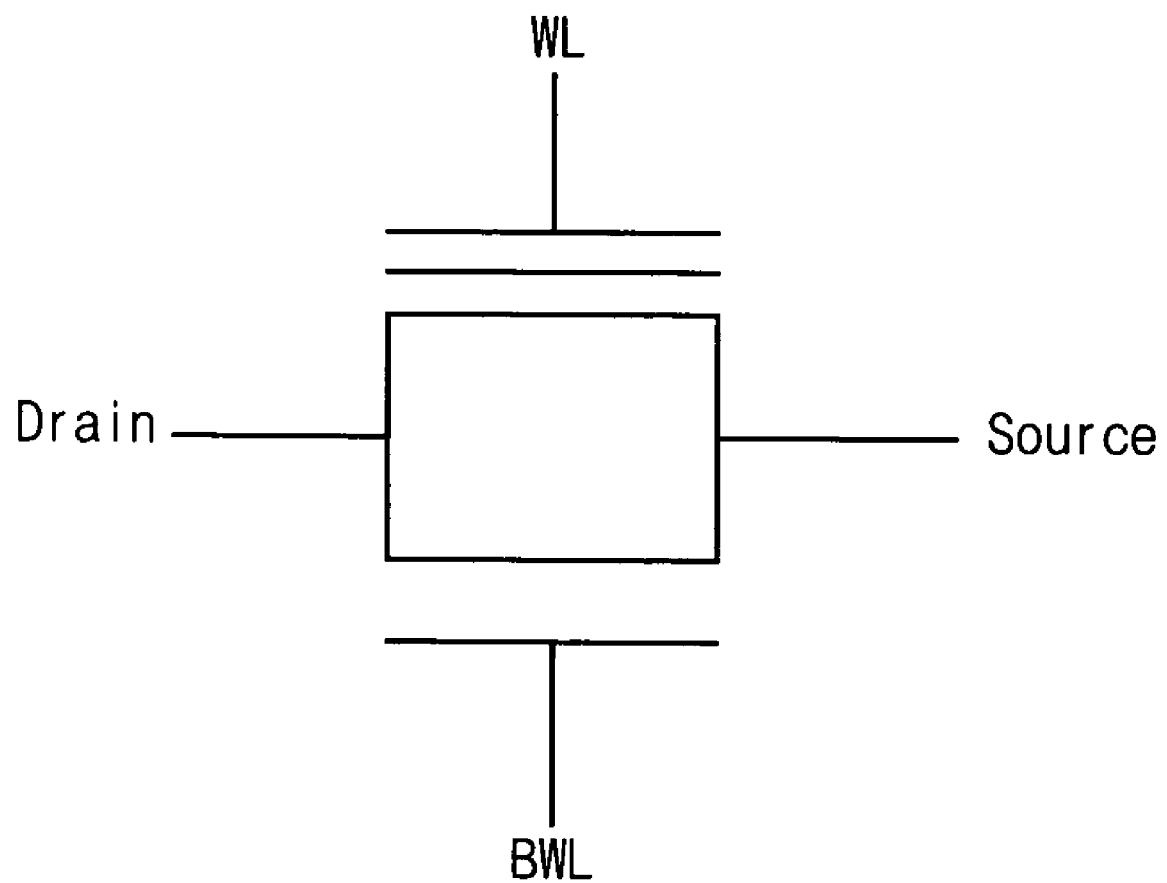

The above-described unit memory cell according to the embodiment of the present invention is represented by a symbol shown in FIG. 2c.

Figure 3A:
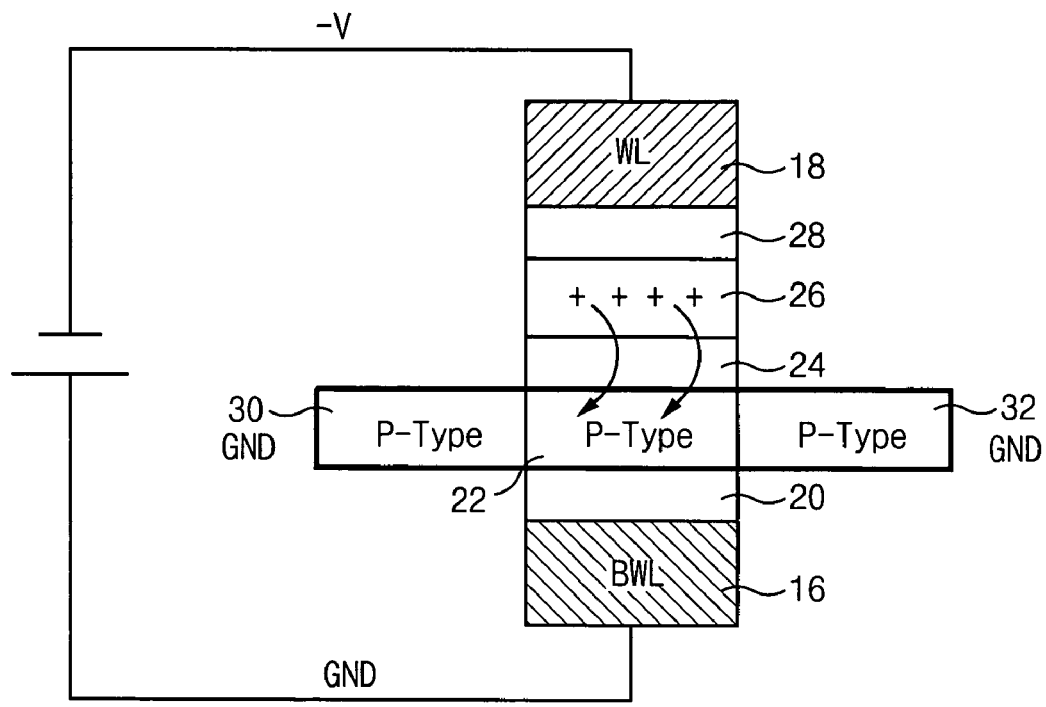
FIGS. 3a and 3b are diagrams illustrating write and read operations on high level data "1" of a charge trap insulator memory device according to an embodiment of the present invention.
Figure 3B:
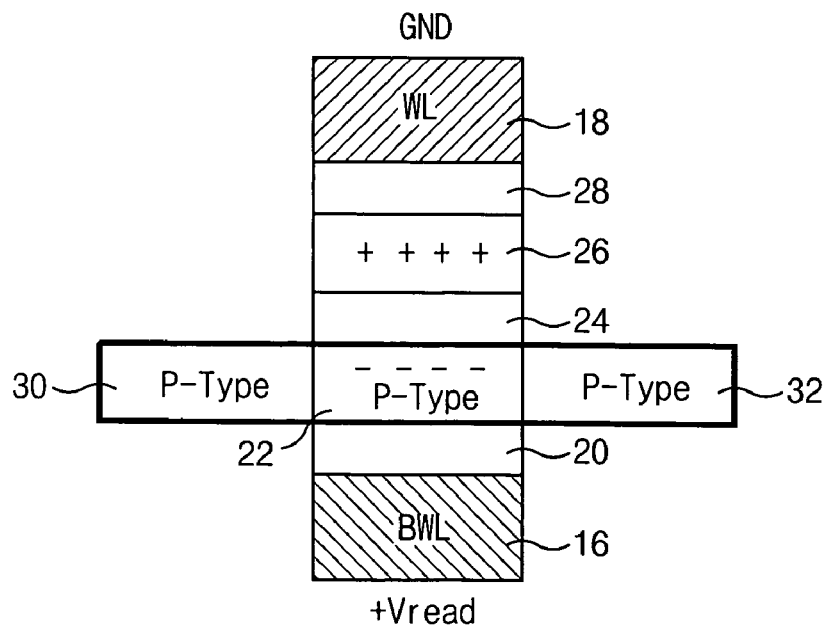

FIGS. 3a and 3b are diagrams illustrating write and read operations on high level data "1" of a charge trap insulator memory device according to an embodiment of the present invention.

FIG. 3a is a diagram illustrating the write operation of high level data "1".

A ground voltage GND is applied to the bottom word line 16, and a negative voltage −V is applied to the top word line 18. Here, the drain region 30 and the source region 32 become at a ground voltage GND state.

In this case, when a voltage is applied between the charge trap insulator 26 and the channel region 22 by voltage division of a capacitor among the first insulating layer 20, the second insulating layer 24 and the third insulating layer 28, electrons are emitted to the channel region 22. As a result, the positive charges are accumulated in the charge trap insulator 26.

FIG. 3b is a diagram illustrating the read operation of high level data "1".

When the ground voltage GND is applied to the top word line 18, and a positive voltage +Vread is applied to the bottom word line 16, negative charges are induced to an upper portion 22a and a lower portion 22b of the channel region 22, so that a depletion layer is formed to interrupt a current path. As a result, the channel region 22 is turned off.

Figure 4:
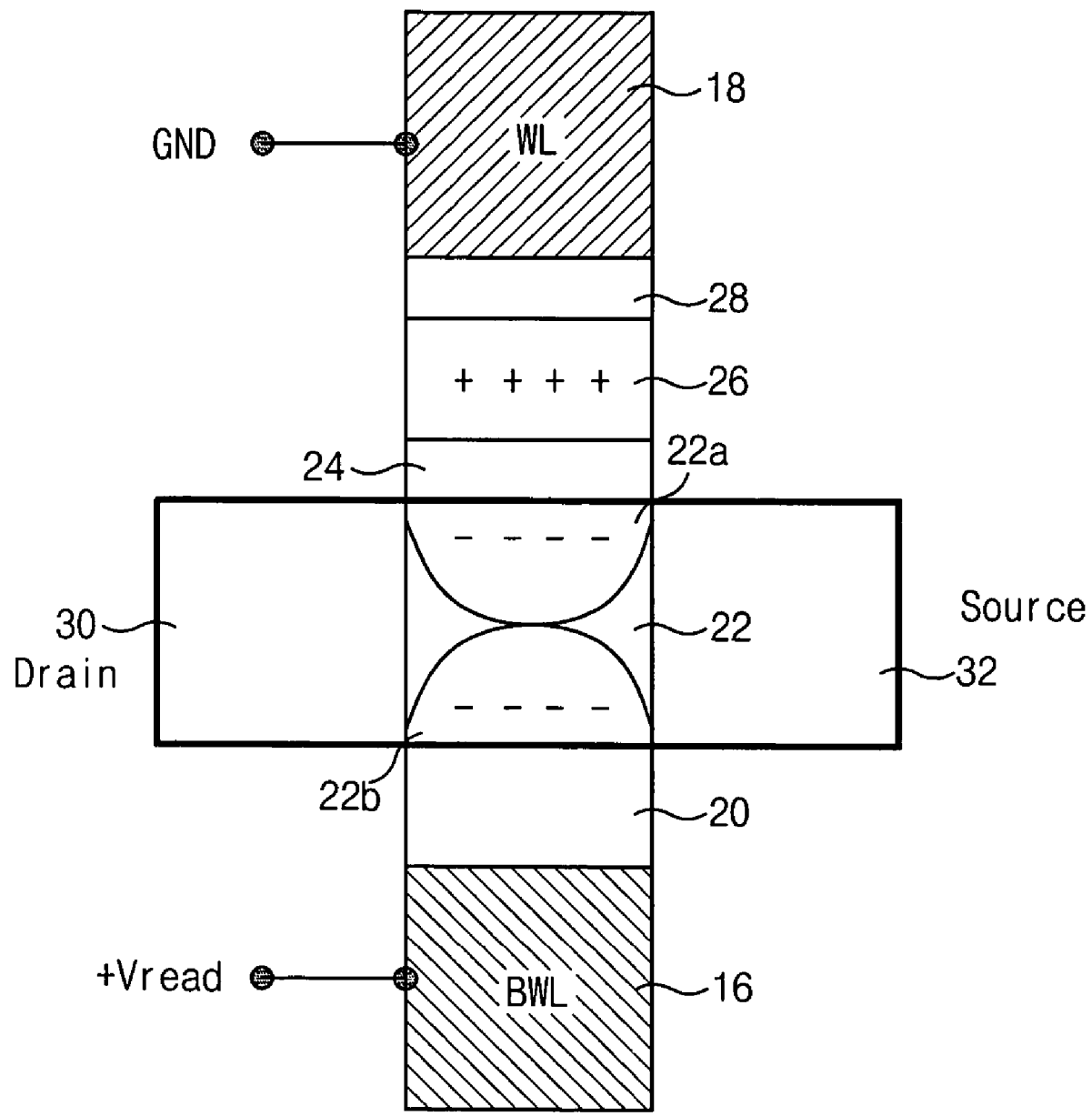
FIG. 4 is a diagram illustrating the read operation on the data "1" of FIG. 3b.

FIG. 4 is a diagram illustrating the read operation on the data "1" of FIG. 3b.

The depletion layer is formed in the upper portion 22a of the channel 22 by positive charges stored in the charge trap insulator 26. The depletion layer is also formed in the lower portion 22b of the channel 22 when the positive voltage +Vread is applied to the bottom word line 16. As a result, a current path of the channel 22 is intercepted by the depletion layers 22a and 22b, so that the channel 22 becomes at a high resistance state to be turned off.

Here, when a slight voltage difference is applied to the drain 30 and the source 32, a small amount of off current flows because the channel 22 is turned off.

Figure 5A:
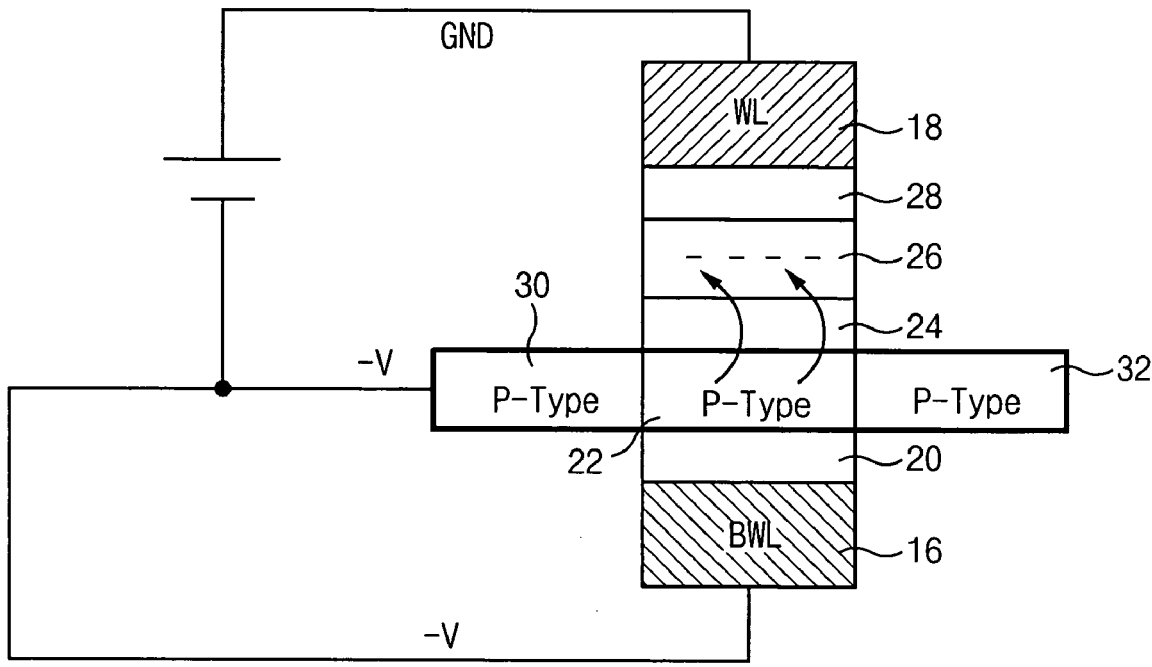
FIGS. 5a and 5b are diagrams illustrating write and read operations on low level data "0" of a charge trap insulator memory device according to an embodiment of the present invention.
Figure 5B:
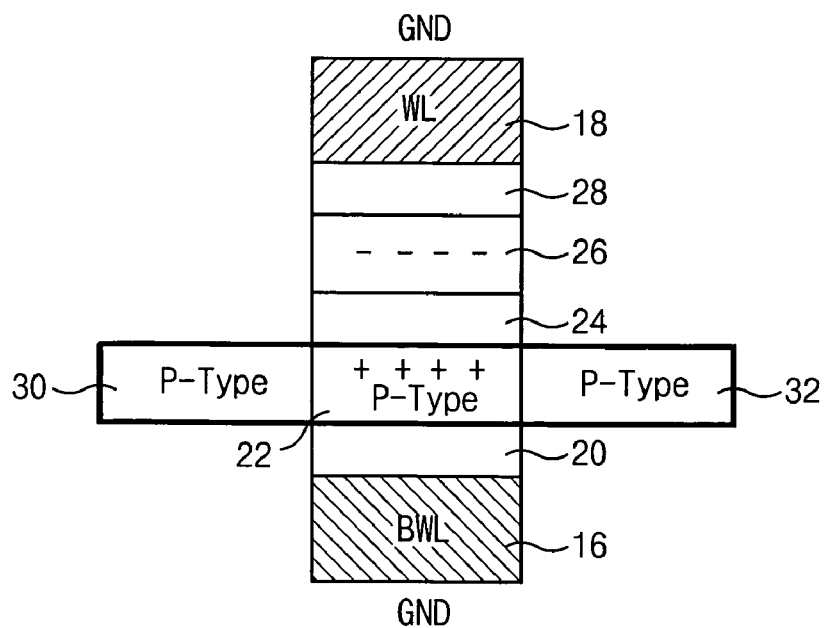

FIGS. 5a and 5b are diagrams illustrating write and read operations on low level data "0" of a charge trap insulator memory device according to an embodiment of the present invention.

FIG. 5a is a diagram illustrating the write operation of low level data "0".

A negative voltage −V is applied to the drain region 30, the source region 32 and the bottom word line 18, and a ground voltage GND is applied to the top word line 18, electrons of the channel region 22 move toward the charge trap insulator 26, so that the electrons are accumulated in the charge trap insulator 26.

FIG. 5b is a diagram illustrating the read operation of the low level data "0".

When the ground voltage GND is applied to the bottom word line 16 and the top word line 18, and a slight voltage difference is applied between the drain region 30 and the source region 32, the channel is turned off, so that a large of on current flows.

Figure 6:
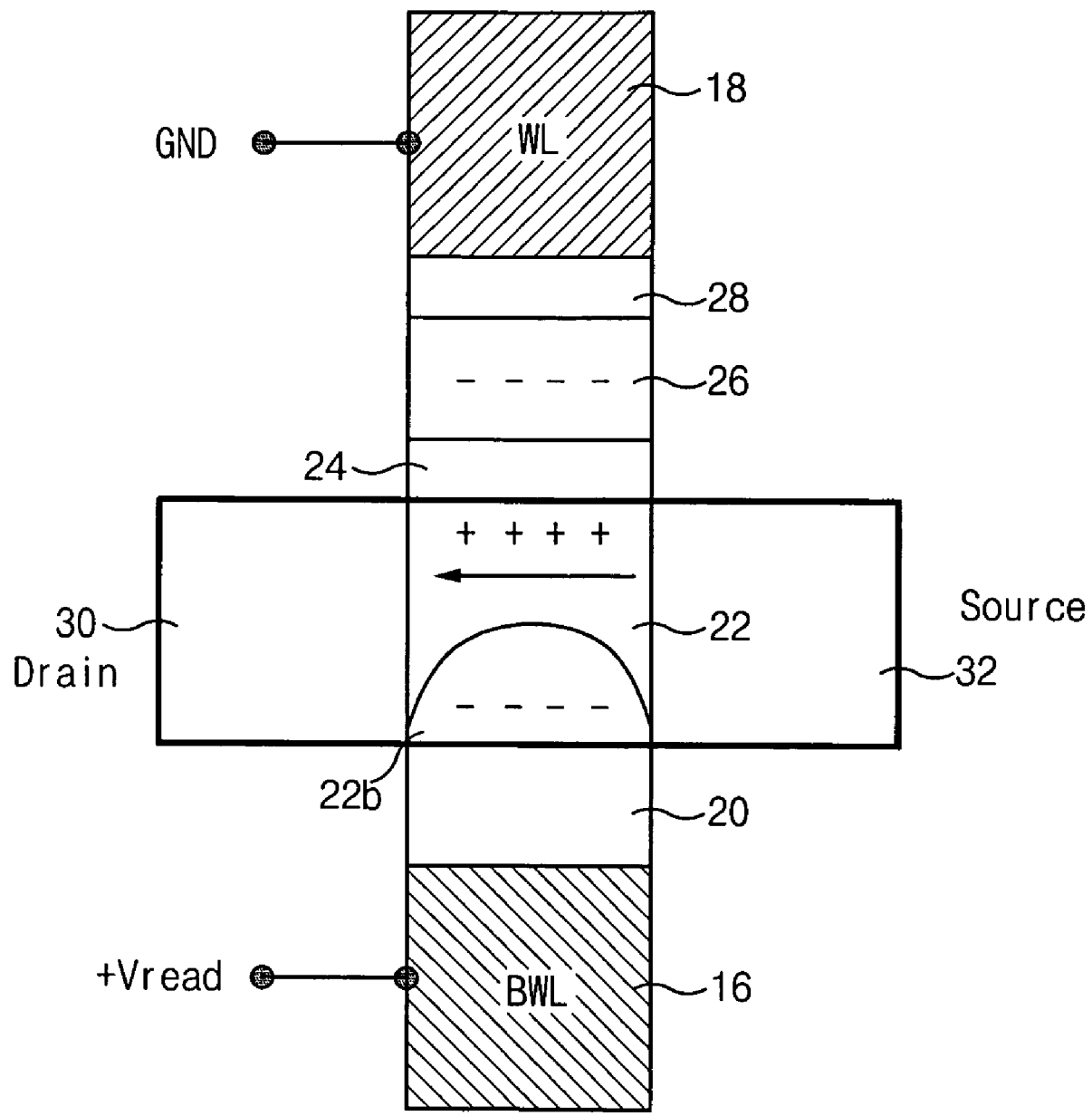
FIG. 6 is a diagram illustrating the read operation on the data "0" of FIG. 5b.

FIG. 6 is a diagram illustrating the read operation on the data "0" of FIG. 5b.

The positive voltage +Vread is applied to the bottom word line 16 to form the depletion layer in the lower portion 22b of the channel 22. However, the depletion layer is not formed in the upper portion of the channel 22, so that current flows through the channel region.

Here, when a slight voltage difference is applied between the drain 30 and the source 32, a large amount of on current flows because the channel 22 is turned on.

In this way, at the read mode, the top word line 18 and the bottom word line 16 are set at the ground voltage GND level not to apply a voltage stress to the charge trap insulator 26, so that the retention characteristic of the memory cell is improved.

As a result, a depletion channel memory cell having a charge trap insulator of a nano scale level performs a low voltage operation.

Figure 7:
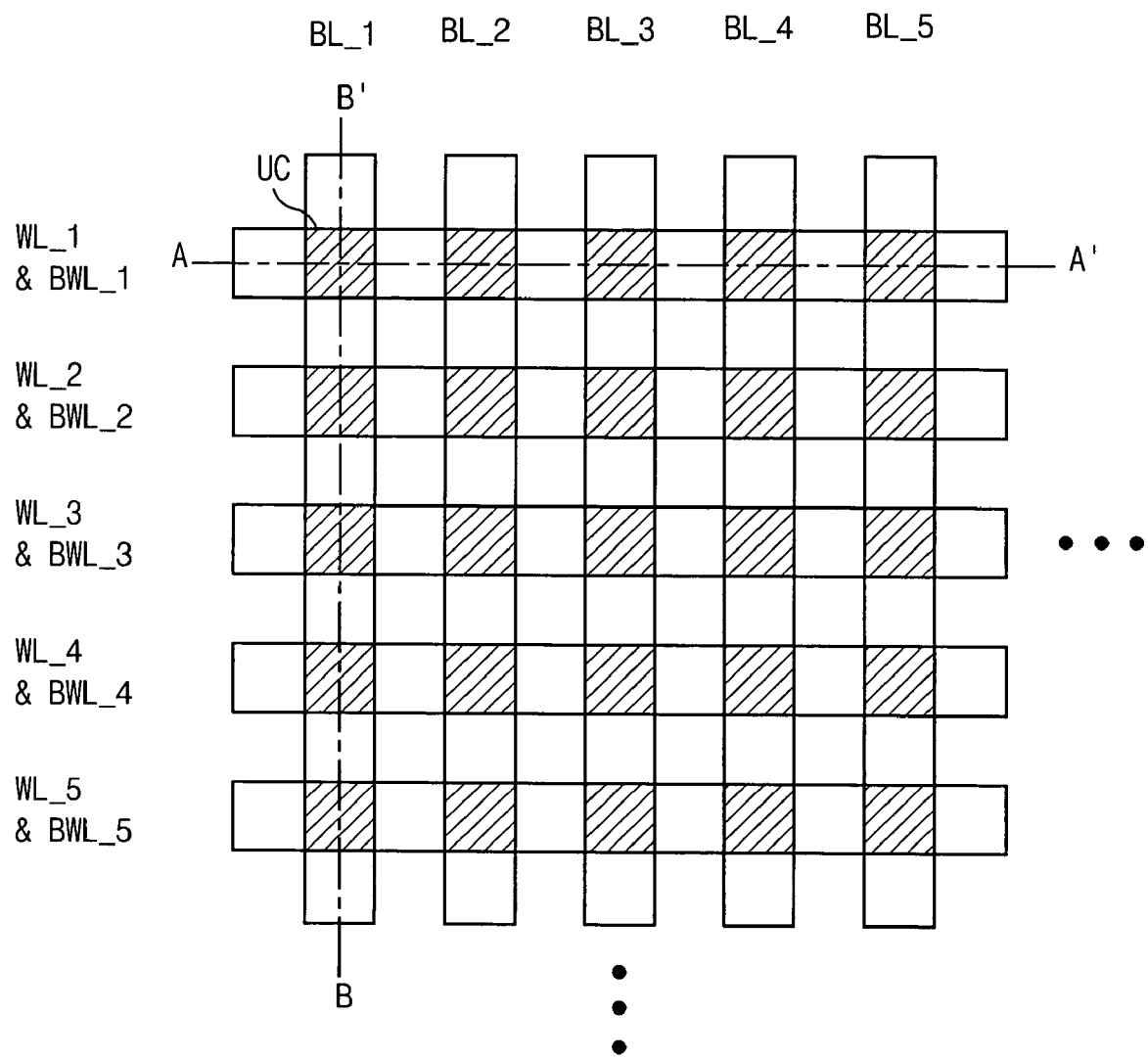
FIG. 7 is a layout plane diagram illustrating a charge trap insulator memory device according to an embodiment of the present invention.

FIG. 7 is a layout plane diagram illustrating a charge trap insulator memory device according to an embodiment of the present invention.

Referring to FIG. 7, a plurality of unit memory cells UC are arranged where a plurality of word lines WL and a plurality of bit lines BL are crossed.

The top word line WL is arranged in parallel with the bottom word line BWL in the same direction, and located perpendicular to the bit line BL.

Figure 8A:
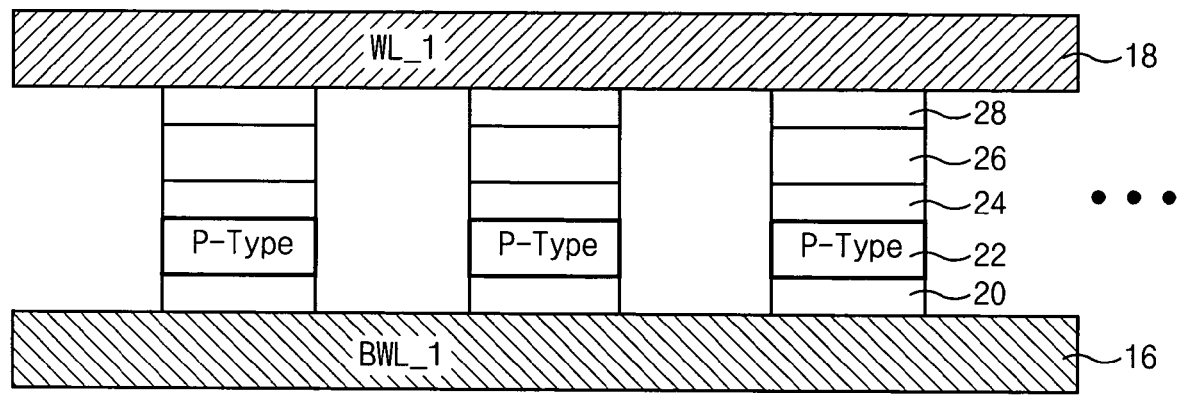
FIG. 8a is a cross-sectional diagram of a direction A–A' in parallel with a word line WL of FIG. 7.

FIG. 8a is a cross-sectional diagram of a direction A–A' in parallel with a word line WL of FIG. 7.

Referring to FIG. 8a, a plurality of unit memory cells UC are formed between the same bottom word line 16 BWL_1 and the top word line 18 WL_1 in a column direction.

Figure 8B:
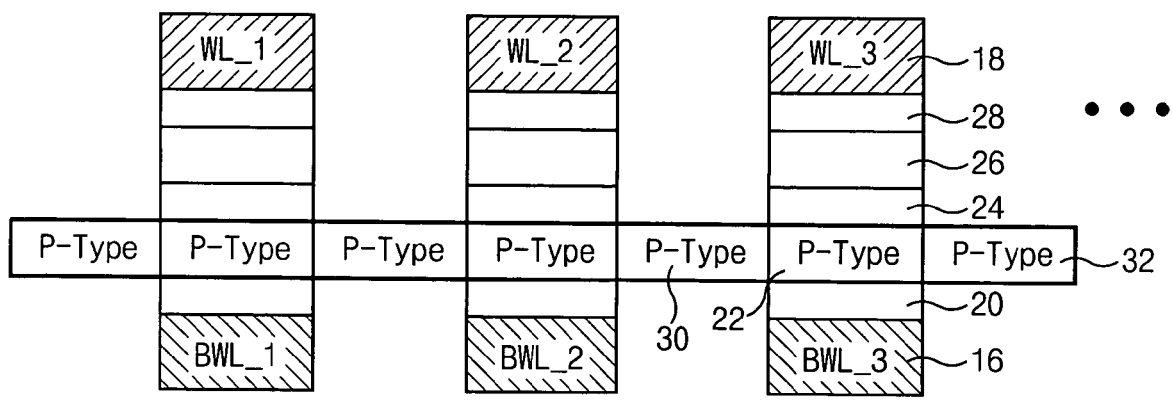
FIG. 8b is a cross-sectional diagram of a direction B–B' perpendicular to a word line WL of FIG. 7.

FIG. 8b is a cross-sectional diagram of a direction B–B' perpendicular to a word line WL of FIG. 7.

Referring to FIG. 8b, a plurality of unit memory cells UC are formed in the same bit line BL_1 in a row direction.

Figure 9:
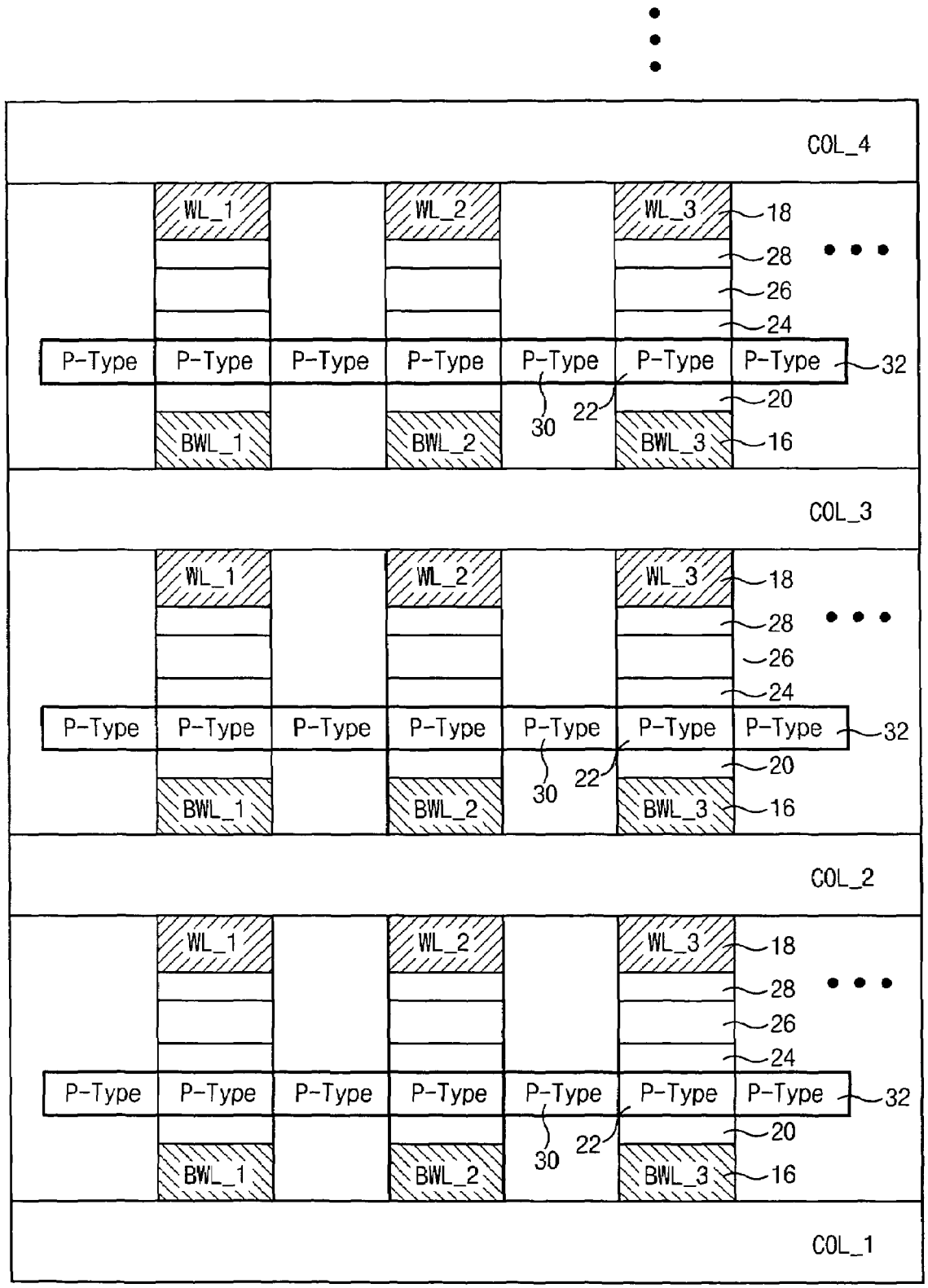
FIG. 9 is a cross-sectional diagram illustrating a charge trap insulator memory device having a multiple layer structure according to an embodiment of the present invention.

FIG. 9 is a cross-sectional diagram illustrating a charge trap insulator memory device having a multiple layer structure according to an embodiment of the present invention.

Referring to FIG. 9, a plurality of cell oxide layers COL_1~COL_4 are formed, and a plurality of charge trap insulator cell arrays are deposited in a cross-sectional direction. As a result, the integrated capacity of the cells can be increased in the same area corresponding to the number of deposited cell arrays.

Figure 10:
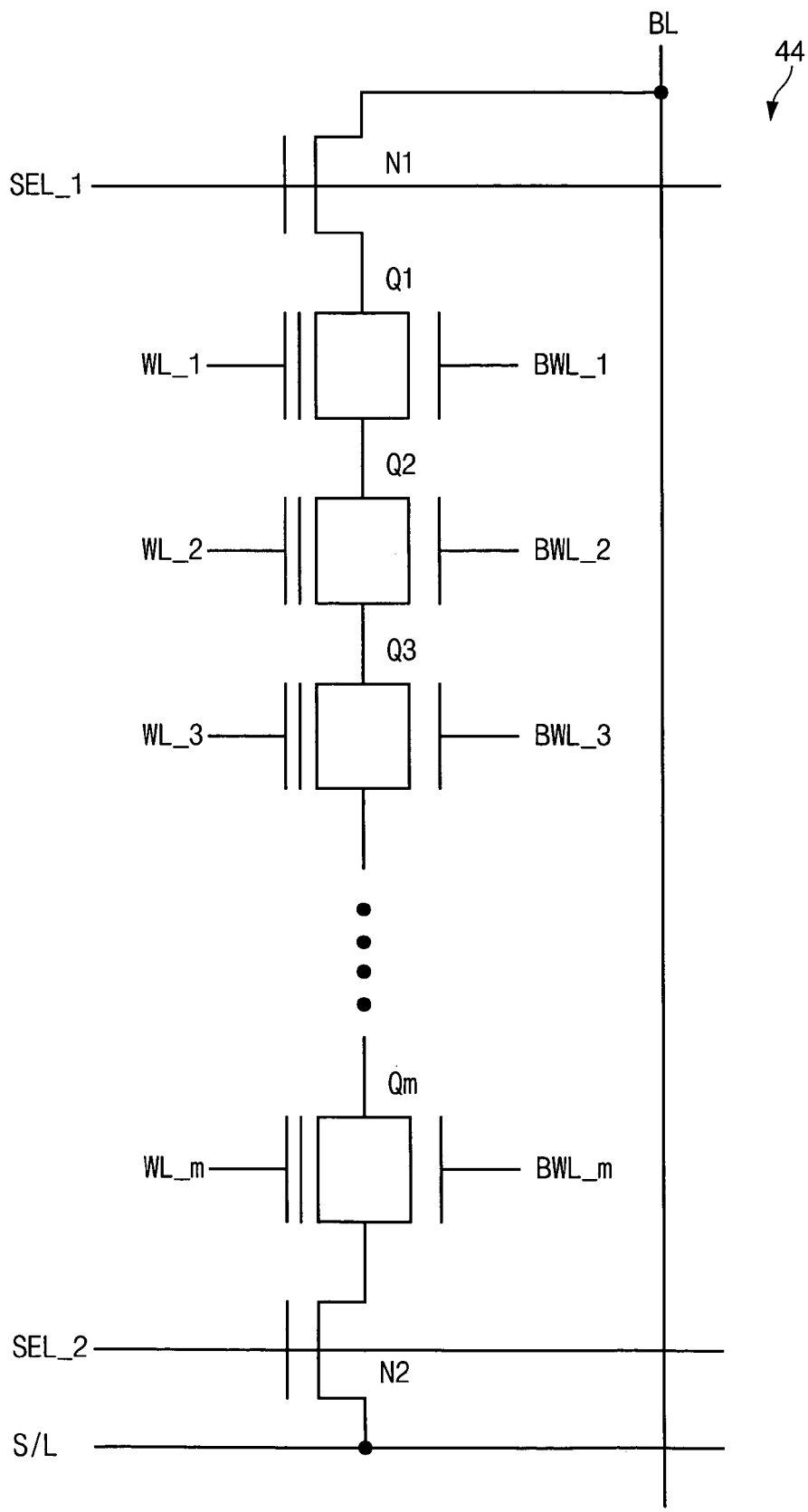
FIG. 10 is a diagram illustrating a unit memory cell array of a charge trap insulator memory device according to an embodiment of the present invention.

FIG. 10 is a diagram illustrating a unit memory cell array 44 of a charge trap insulator memory device according to an embodiment of the present invention.

In the embodiment, the unit memory cell array 44 of FIG. 10 comprises a plurality of memory cells Q1~Qm connected serially, and switching elements N1, N2. Here, the first switching element N1 has a gate to receive a first selecting signal Sel_1 to selectively connect the memory cell Q1 to the bit line BL, and the second switching element N2 has a gate to receive a second selecting signal SEL_2 to selectively connect the memory cell Qm to a sensing line S/L.

The plurality of memory cells Q1~Qm, which are connected serially between the switching elements N1 and N2, selectively perform a switching operation by a plurality of top word lines WL_1~WL_m and a plurality of bottom word lines BWL_1~BWL_m that are driven by the same row address decoder. Here, the detailed structure of each memory cell Q1~Qm is shown in FIGS. 2a and 2b.

Figure 11:
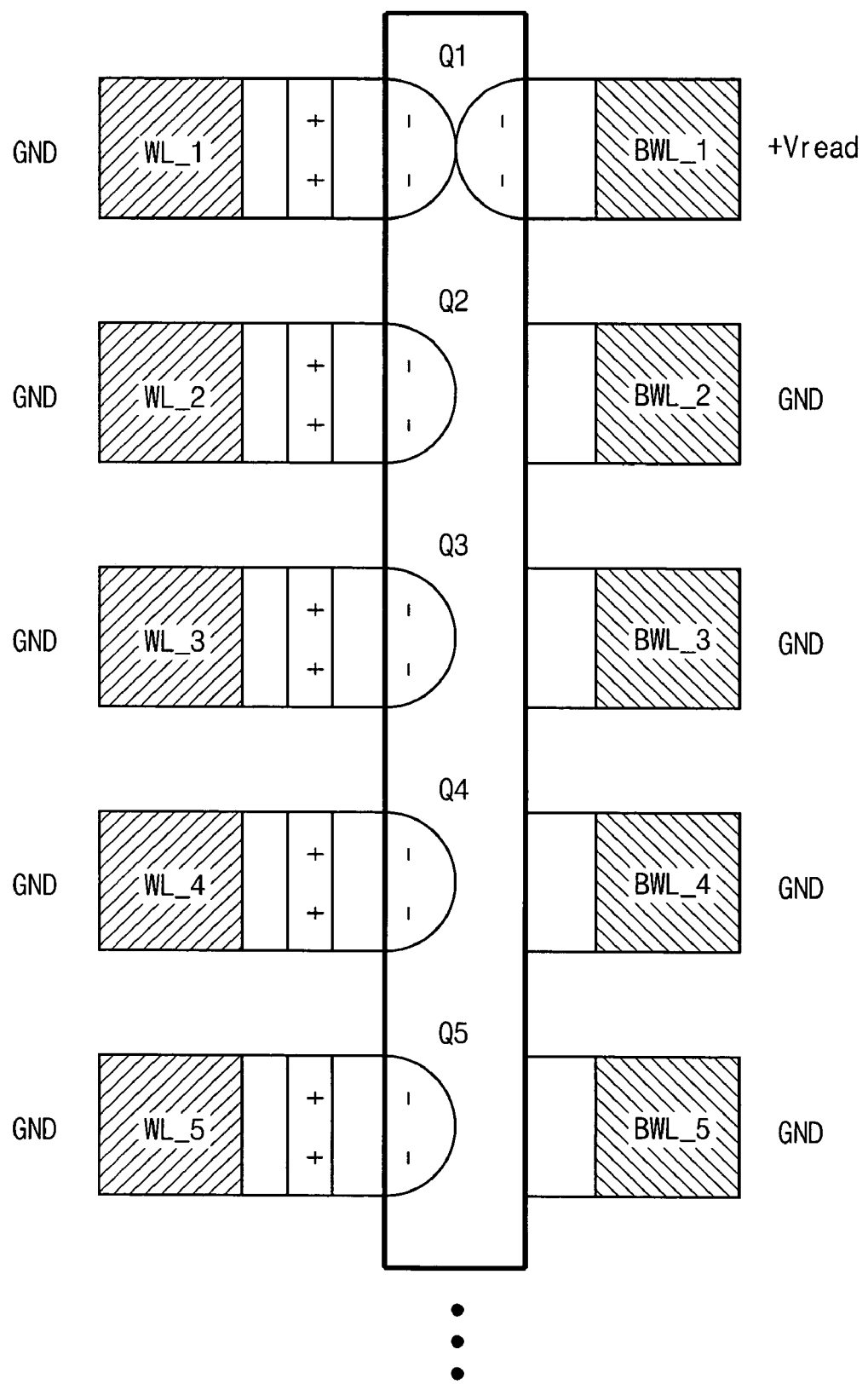
FIG. 11 is a diagram illustrating the read operation of low data "0" in the unit memory cell array of FIG. 10.

FIG. 11 is a diagram illustrating the read operation of low data "0" in the unit memory cell array of FIG. 10. Here, FIG. 11 shows an example when high level data "1" is stored in all of the memory cells Q1~Q5.

The ground voltage GND is applied to all of the top word lines WL_1~WL_5, and the read voltage +Vread having a positive value is applied to the bottom word line BWL_1 of the selected memory cell Q1. Then, the ground voltage GND is applied to the unselected bottom word lines BWL_2~BWL_5.

In the unselected memory cells Q2~Q5, the ground voltage GND is applied to the top word lines WL_2~WL_5 and the bottom word lines BWL_2~BWL_5. As a result, although the depletion layer is formed in the upper portion 22a of the channel region 22 by charges stored in the charge trap insulator 26, the depletion layer is not formed in the lower portion 22b, so that the channel is turned on.

On the other hand, in the selected memory cell Q1, the depletion layer 22b is formed in the lower region of the channel region 22 by the read voltage +Vread applied to the bottom word line BWL_1, and the depletion layer 22b is formed in the upper portion of the channel region 22 by the polarity of charges stored in the charge trap insulator 26. Then, the channel 22 is turned off by the depletion layers 22a and 22b formed in the channel region 22, so that the current path is intercepted from the source region 32 to the drain region 30. As a result, the data "1" stored in the selected memory cell Q1 is read at the read mode.

Figure 12:
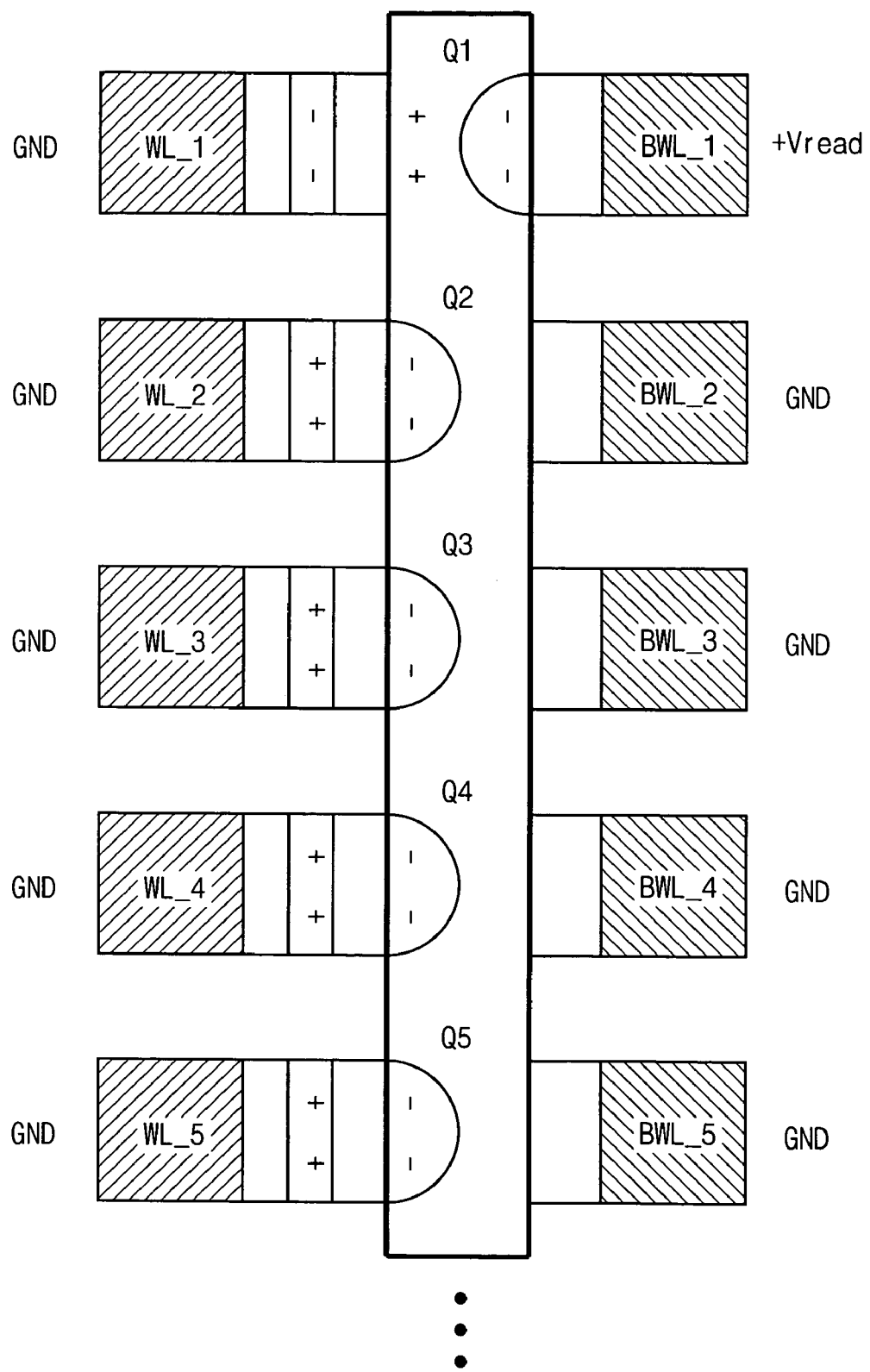
FIG. 12 is another diagram illustrating the read operation of low data "0" in the unit memory cell array of FIG. 10.

FIG. 12 is a diagram illustrating the read operation of low data "0" in the unit memory cell array of FIG. 10. Here, FIG. 12 shows an example when the low level data "0" is stored in the selected memory cell Q1 and the high level data "1" is stored in the rest memory cells Q2~Q5.

In this case, the ground voltage GND is applied to all of the word lines WL_1~WL_5, and the read voltage +Vread having a positive value is applied to the bottom word line BWL_1 of the selected memory cell Q1. Then, the ground voltage GND is applied to the unselected bottom word lines BWL_2~BWL_5.

As a result, the read voltage +Vread having a positive value is applied to the bottom word line BWL_1 of the selected memory cell Q1, so that the depletion layer is formed in the lower portion 22b of the channel region 22. However, the channel is turned on because the depletion layer is not formed in the upper portion 22a of the channel region 22 by the polarity of charges stored in the charge trap insulator 26. Meanwhile, the depletion layer is formed in the upper portion 22a of the channel region 22 by the polarity of charges stored in the unselected memory cells Q2~Q5. However, the channel is turned on because the ground voltage GND is applied to the bottom word line BWL_2~BWL_5 so that the depletion layer is not formed in the lower portion 22b of the channel region 22.

As a result, the channel region 22 of the memory cells Q1~Q5 is turned on, so that current flows from the source region 32 to the drain region 30. Thus, the data "0" stored in the selected memory cell Q1 can be read at the read mode.

Figure 13A:
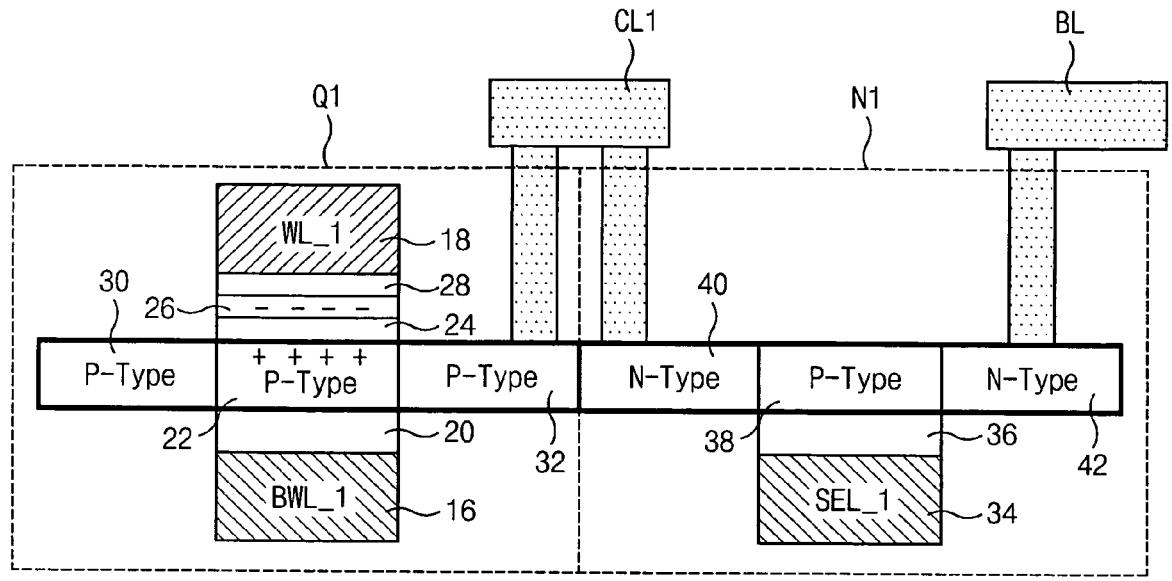
FIGS. 13a and 13b are diagrams illustrating the connection relationship of memory cells Q1, Qm and switching elements N1, N2 of FIG. 10.
Figure 13B:
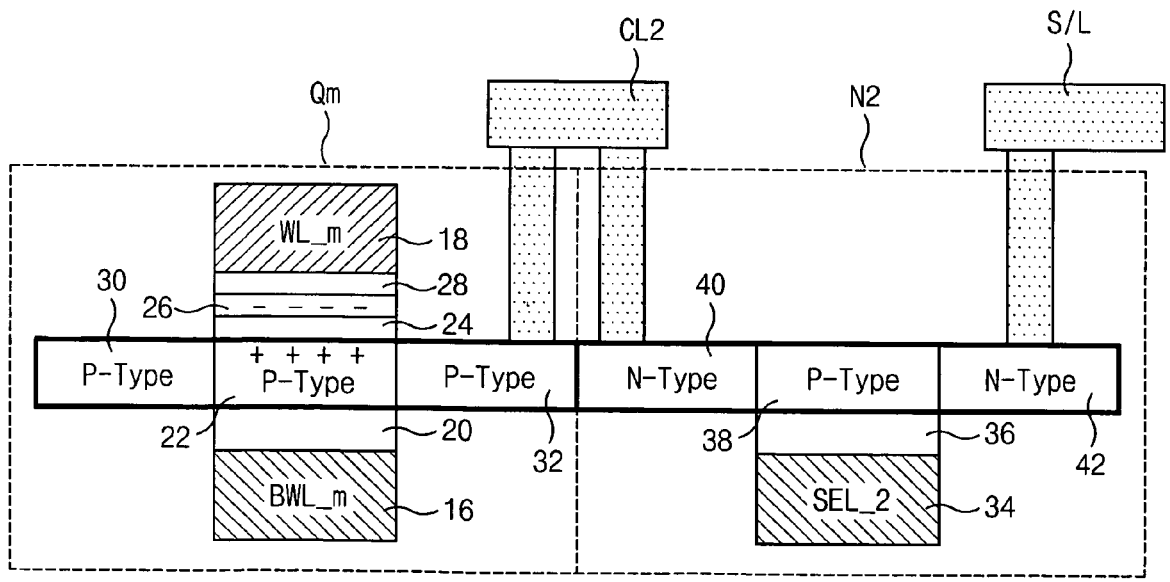

FIGS. 13a and 13b are diagrams illustrating the connection relationship of memory cells Q1, Qm and switching elements N1, N2 of FIG. 10.

Each of the switching elements N1 and N2 comprises a P-type channel region 38 formed on an insulating layer 36, a N-type drain region 40 and a N-type source region 42 which are connected to both sides of the P-type channel region 38.

Referring to FIG. 13a, the N-type source region 42 of the switching element N1 is connected to the bit line BL through a contact plug. The N-type drain region 40 is connected to the P-type source region 32 of the memory cell Q1 through the contact plug and a connection line CL1.

Referring to FIG. 13b, the N-type source region 42 of the switching element N2 is connected to the bit line BL through the contact plug, and the N-type drain region 40 is connected to the P-type source region 32 of the memory cell Qm through the contact plug and the connection line CL1.

Here, the connection line CL1 for connecting the switching elements N1, N2 to the memory cells Q1, Qm is formed of a metal conductor.

Figure 14:
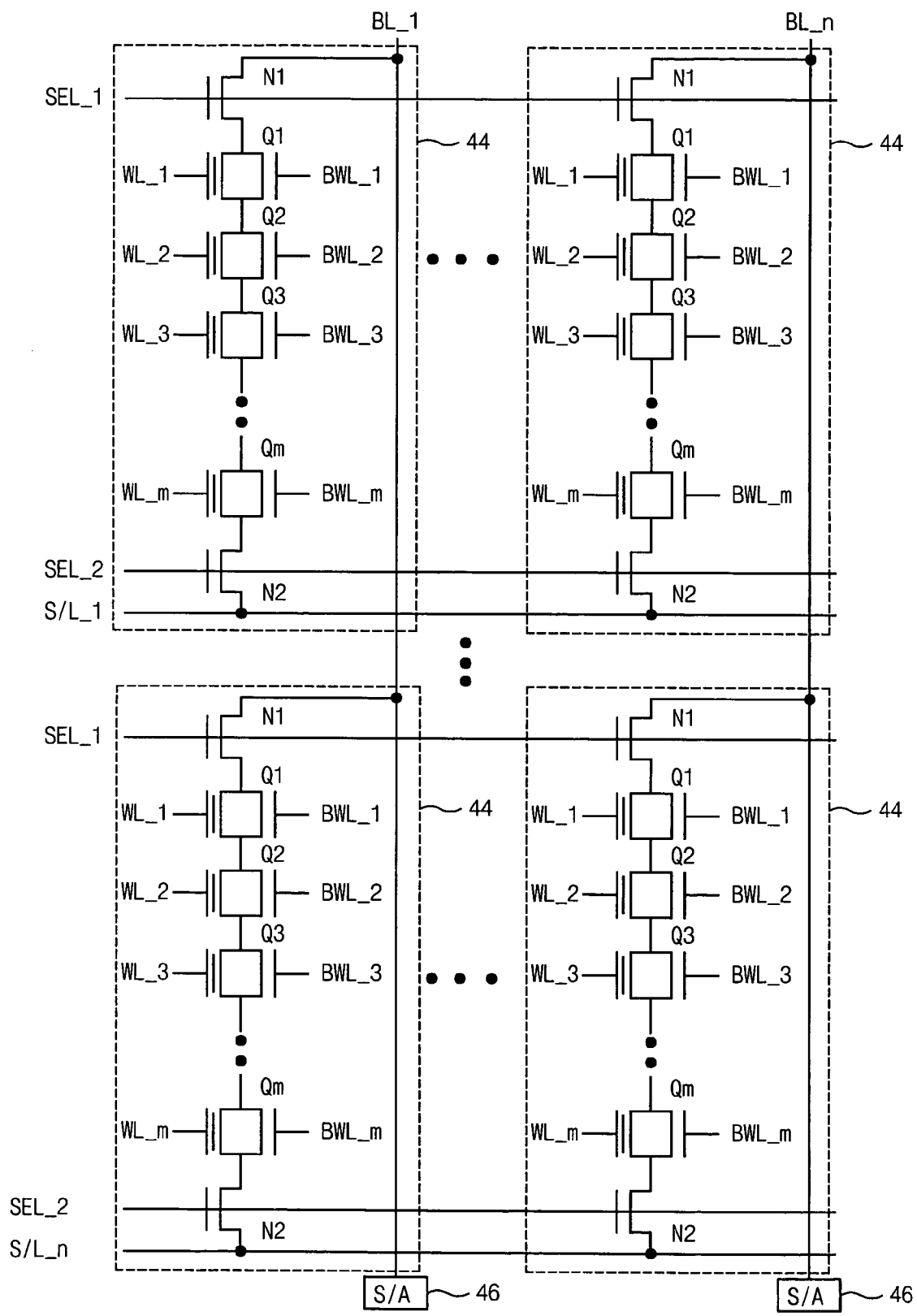
FIG. 14 is a circuit diagram illustrating a memory cell array of a charge trap insulator memory device according to an embodiment of the present invention.

FIG. 14 is a circuit diagram illustrating a memory cell array of a charge trap insulator memory device according to an embodiment of the present invention.

In the embodiment, the charge trap insulator memory device of FIG. 14 comprises a plurality of unit memory cell arrays 44 of FIG. 7 which are connected in common to a plurality of bit lines BL_1~BL_n in a column direction, and in common to a plurality of top word lines WL_1~WL_m, a plurality of bottom word lines BWL_1~BWL_m, a first selecting signal SEL_1, a second selecting signal SEL_2 and a plurality of sensing lines S/L_1~S/L_n in a row direction. Here, the plurality of bit lines BL_1~BL_n are connected one by one to a plurality of sense amplifiers 46.

Figure 15:
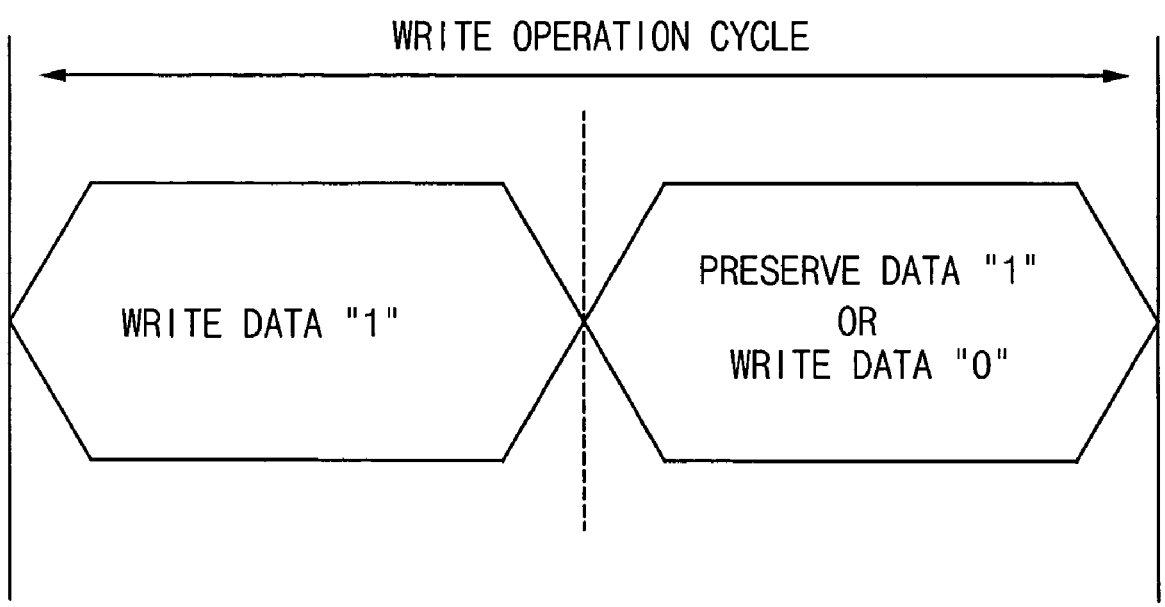
FIG. 15 is a diagram illustrating a write operation of the charge trap insulator memory device according to an embodiment of the present invention.

FIG. 15 is a diagram illustrating a write operation of the charge trap insulator memory device according to an embodiment of the present invention.

In the charge trap insulator memory device according to the embodiment of the present invention, a write operation cycle can be divided into two sub operation regions. That is, the data "1" is written in the first sub operation region. In the second sub operation region, the data "1" written in the first sub operation region is preserved or the data "0" is written.

If a high voltage is applied to the bit line BL in a predetermined period when the data "1" is required to be preserved, a value of the data "1" written in the first sub operation region can be preserved in the memory cell.

Figure 16:
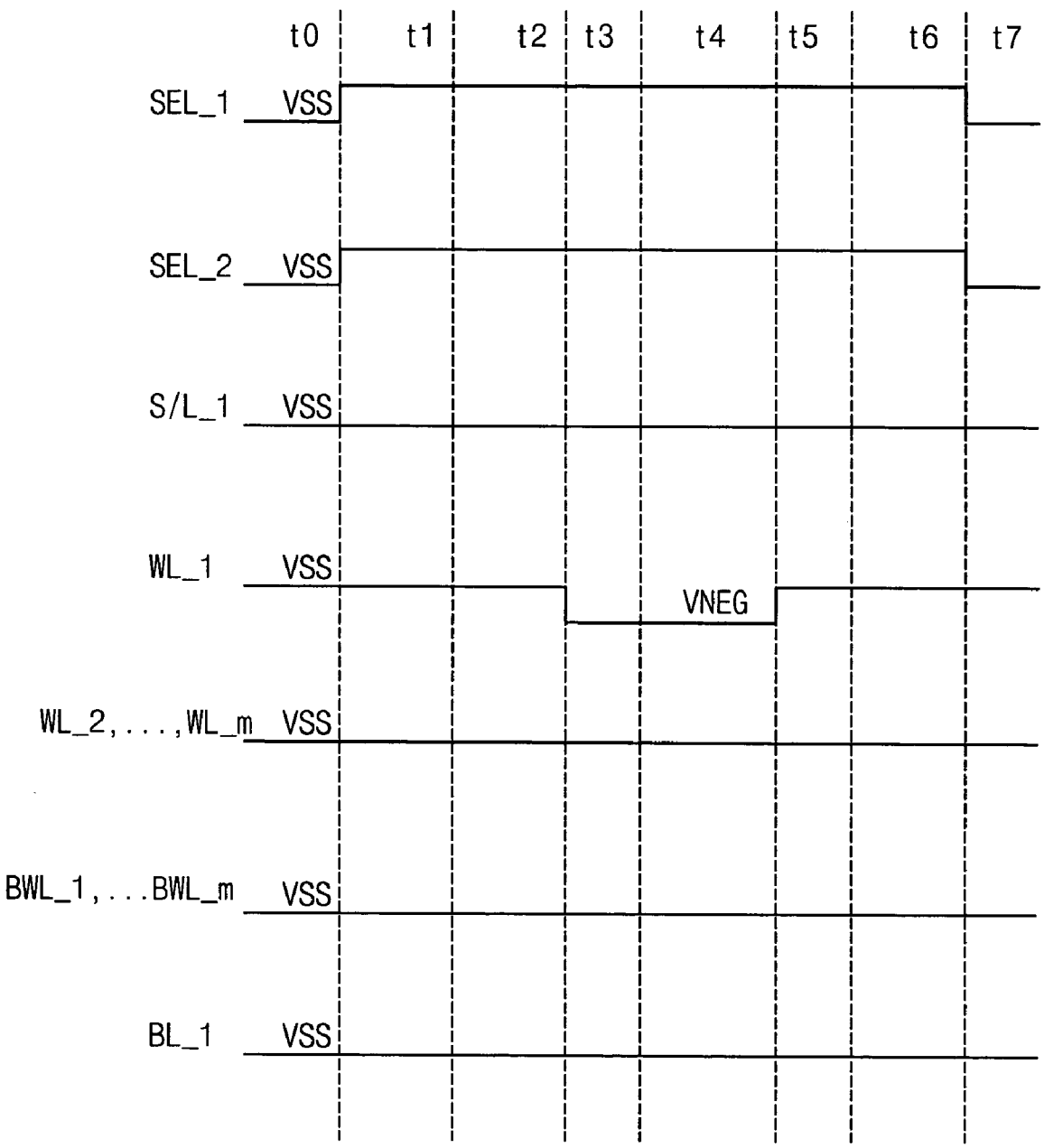
FIG. 16 is a timing diagram illustrating the write operation on data "1" of the charge trap insulator memory device according to an embodiment of the present invention.

FIG. 16 is a timing diagram illustrating the write operation on data "1" of the charge trap insulator memory device according to an embodiment of the present invention. Here, FIG. 16 shows an example where the first memory cell Q1 of the first unit memory cell array 44 of FIG. 14 is selected.

First, in a period t0 which is a precharge period of the memory cell, all signals and lines are precharged to a ground voltage VSS.

In periods t1 and t2, when the first selecting signal SEL_1 and the second selecting signal SEL_2 transit to 'high' to turn on the switching elements N1 and N2, the bit line BL_1 is connected to a source of the memory cell Q1, and the sensing line S/L is connected to a drain of the memory cell Qm. Here, the plurality of top word lines WL_1~WL_m, the plurality of bottom word lines BWL_1~BWL_m, the bit line BL_1 and the sensing line S/L_1 are maintained at a low level.

In periods t3 and t4, when a negative voltage VNEG is applied to the word line WL_1 connected to the selected memory cell Q1, as shown in FIG. 3a, electrons are emitted to the channel region 22 because a high voltage is applied to the depletion layer between the top word line WL_1 and the channel region 22, so that the data "1" is written.

In periods t5 and t6, the top word line WL_1 is transited to the ground voltage VSS level to complete the write operation.

In a period t7, the first selecting signal SEL_1 and the second selecting signal SEL_2 are transited to the low level, the switching elements N1 and N2 are turned off to start the precharge operation.

Figure 17:
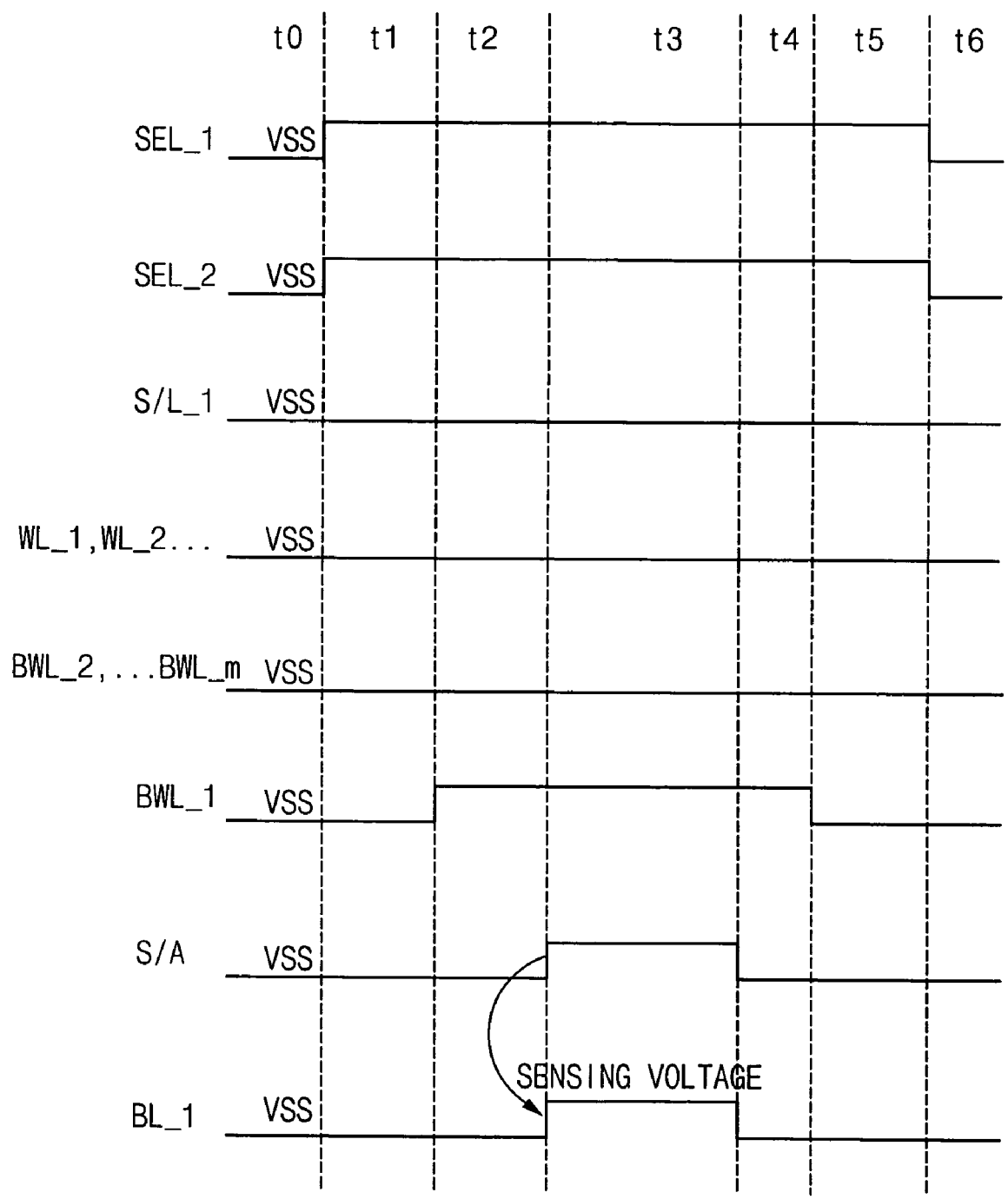
FIG. 17 is a timing diagram illustrating the retention operation of data "1" and the write operation on data "0" of the charge trap insulator memory device according to an embodiment of the present invention.

FIG. 17 is a timing diagram illustrating the retention operation of data "1" and the write operation on data "0" of the charge trap insulator memory device according to an embodiment of the present invention. FIG. 17 shows an example where the first memory cell Q1 of the first unit memory cell array 44 of FIG. 14 is selected.

First, in a period t0 which is a precharge period of the memory cell, all signals and lines are precharged to the ground voltage VSS.

In periods t1 and t2, when the first selecting signal SEL_1 transits to 'high', the first switching element N1 is turned on, so that the bit line BL_1 is connected to the source of the selected memory cell Q1.

Here, the second selecting signal SEL_2 becomes the negative voltage VNEG, so that the second switching device N2 is turned off. Then, the bottom word lines BWL_2~BWL_m which are not connected to the selected memory cell Q1 become the negative voltage VNEG to form a current path.

As a result, data applied to the bit line BL are transmitted to all of the memory cells Q1~Qm.

The plurality of top word lines WL_1~WL_m, the bit line BL_1, and the sensing line S/L_1 are maintained at the low level.

In a period t3, when data to be written in the memory cell Q1 is "0", the bit line BL_1 is transited to the negative voltage VNEG level. On the other hand, the bit line BL_1 is maintained at the low level when the data "1" stored in the memory cell Q1 is required to be maintained.

In a period t4, the bottom word line BWL_1 connected to the selected memory cell Q1 is transited to the negative voltage VNEG level. As shown in FIG. 5a, electrons are accumulated in the P-type channel region 22 of the memory cell Q1 by the top word line WL_1. Then, when the negative voltage VNEG is applied to the top word line BWL_1 to generate a threshold voltage difference, channel electrons are introduced to the charge trap insulator 26. As a result, the data "0" is written in the selected memory cell Q1.

Meanwhile, when the data "1" stored in the selected memory cell Q1 is required to be maintained, the bit line BL_1 is maintained at the ground voltage VSS level. Since there is no voltage difference between the top word line WL_1 of the selected memory cell Q1 and the P-type channel region 22, the data "1" is preserved.

The bottom word line BWL_1 is transited to the ground voltage VSS state again in a period t5, and the bit line BL_1 are transited to the ground voltage VSS state in a period t6, thereby completing the retention operation of the high data "1" or the write operation of the low data "0".

In a period t7, when the selecting signal SEL_1, the second selecting signal SEL_2, and the unselected bottom word lines BWL_2~BWL_m are transited to the low level. As a result, the period t7 becomes the precharge period.

Figure 18:
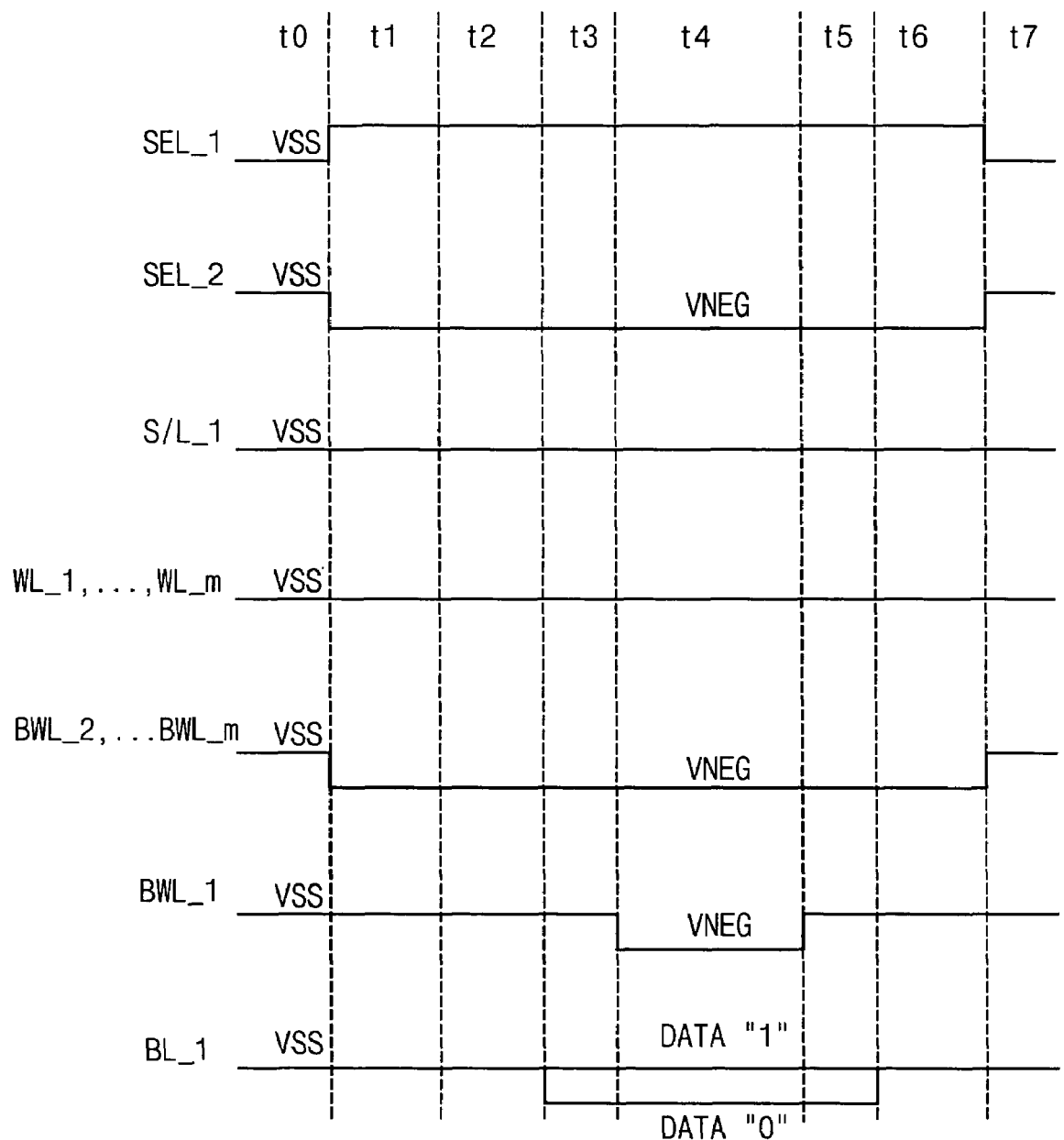
FIG. 18 is a timing diagram illustrating a sensing operation of data stored in a memory cell of the charge trap insulator memory device according to an embodiment of the present invention.

FIG. 18 is a timing diagram illustrating a sensing operation of data stored in a memory cell of the charge trap insulator memory device according to an embodiment of the present invention. Here, FIG. 18 shows an example where the first memory cell Q1 of the first unit memory cell array 44 of FIG. 14 is selected.

First, in a period t0 which is a precharge period of the memory cell, all signals and lines are precharged to the ground voltage VSS.

In a period t1, when the first selecting signal SEL_1 and the second selecting signal SEL_2 are transited to the high level so that the switching elements N1 and N2 are turned on, the bit line BL_1 is connected to the source of the selected memory cell Q1, and the sensing line S/L is connected to the drain of the memory cell Qm. Here, the plurality of top word lines WL_1~WL_m, the plurality of bottom word lines BWL_1~BWL_m, the bit line BL_1 and the sensing line S/L_1 are maintained at the low level.

In a period t2, the bottom word lines BWL_1 connected to the selected memory cell Q1 is transited to the high level, and the bottom word lines BWL_2~BWL_m are maintained at the low level. As a result, the memory cells Q2~Qm except the selected memory cell Q1 are all turned on, so that the source of the selected memory cell Q1 is connected to the ground voltage VSS.

Here, all of the word lines WL_1~WL_m are maintained at the ground voltage VSS state, so that the flowing of current between the bit line BL_1 and the sensing line S/L is determined depending on the polarity formed in the selected memory cell Q1.

In a period t3, the sense amplifier enable signal S/A is transited to a high level to operate the sense amplifier 46. Then, when a sensing voltage VS is applied to the bit line BL_1, the flowing of current in the bit line BL_1 is determined depending on the polarity of the selected memory cell Q1.

That is, as shown in FIG. 3b, when current is not applied to the bit line BL_1, it is understood that the data "1" is stored in the selected memory cell Q1.

On the other hand, as shown in FIG. 5b, when a current of over a predetermined value is applied to the bit line BL_1, it is understood that the data "0" is stored in the selected memory cell Q1.

In a period t4, when the sense amplifier enable signal S/A is at the ground voltage VSS level so that the operation of the sense amplifier 46 is stopped, the bit line BL_1 is transited to the low level to complete the sensing operation.

In a period t5, the bottom word line BWL_1 connected to the selected memory cell Q1 is transited to the ground voltage level.

In a period t6, the first selecting signal SEL_1 and the second selecting signal SEL_2 are transited to the low level, so that the switching elements N1 and N2 are turned off.

As a result, the data of the cell are not destroyed using a NDRO (Non Destructive Read Out) at the read mode in the embodiment of the present invention.

As described above, a charge trap insulator memory device according to an embodiment of the present invention has a memory cell structure using a charge trap insulator of a nano scale level to overcome a scale down phenomenon.

Additionally, in the charge trap insulator memory device, a plurality of charge trap insulator cell arrays are deposited vertically using a plurality of cell oxide layers to improve cell integrated capacity corresponding to the number of deposited cell arrays.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A charge trap insulator memory device comprising:
   a bottom word line;
   a first insulating layer formed on the bottom word line;
   a P-type float channel formed on the first insulating layer and kept at a floating state;
   a second insulating layer formed on the P-type float channel;
   a charge trap insulator, formed on the second insulating layer, where charges are stored;
   a third insulating layer formed on the charge trap insulator;
   a top word line formed on the third insulating layer; and
   a P-type drain region and a P-type source region formed at both sides of the P-type float channel,
   wherein data are written in the charge trap insulator by a voltage difference of the top word line and the float channel, and
   data are read according to different channel resistance induced to the float channel depending on polarity states of charges stored in the charge trap insulator while a positive read voltage is applied to the bottom word line.

2. The charge trap insulator memory device according to claim 1, wherein the P-type float channel, the P-type drain region and the P-type source region are formed of at least one of carbon nano tube, silicon, germanium and organic semiconductor.

3. The charge trap insulator memory device according to claim 1, wherein when electrons are stored in the charge trap insulator, positive charges are induced to the channel region to cause a low resistance state so that the float channel is turned on.

4. The charge trap insulator memory device according to claim 1, wherein when positive holes are stored in the charge trap insulator, negative charges are induced to cause a high resistance state, so that the float channel is turned off.

5. A charge trap insulator memory device comprising:
   a plurality of unit memory cell arrays each including a plurality of charge trap insulator memory cells and deposited as a multiple layer,
   wherein the charge trap insulator memory cell comprises:
   a bottom word line;
   a first insulating layer formed on the bottom word line;
   a P-type float channel formed on the first insulating layer and kept at a floating state;
   a second insulating layer formed on the P-type float channel;
   a charge trap insulator, formed on the second insulating layer, where charges are stored;
   a third insulating layer formed on the charge trap insulator;
   a top word line formed on the third insulating layer; and
   a P-type drain region and a P-type source region formed at both sides of the float channel,
   wherein data are written in the charge trap insulator by a voltage difference of the top word line and the float channel, and
   data are read according to different channel resistance induced to the float channel depending on polarity states of charges stored in the charge trap insulator while a positive read voltage is applied to the bottom word line.

6. The charge trap insulator memory device according to claim 5, wherein the P-type float channel, the P-type drain region and the P-type source region are formed of at least one of carbon nano tube, silicon, germanium and organic semiconductor.

7. The charge trap insulator memory device according to claim 5, wherein when electrons are stored in the charge trap insulator, positive charges are induced to cause a low resistance state, so that the float channel is turned on.

8. The charge trap insulator memory device according to claim 5, wherein when positive holes are stored in the charge trap insulator, negative charges are induced to cause a high resistance state, so that the float channel is turned off.

9. A charge trap insulator memory device comprising:
a plurality of memory cells connected serially where data applied through a bit line depending on potentials applied to a top word line and a bottom word line are stored in a charge trap insulator or the data stored in the charge trap insulator are outputted to the bit line;
a first switching element for selectively connecting the plurality of memory cells to the bit line in response to a first selecting signal; and
a second switching element for selectively connecting the plurality of memory cells to a sensing line in response to a second selecting signal,
wherein each of the plurality of memory cells comprises:
a first insulating layer formed on the bottom word line;
a P-type float channel, formed on the first insulating layer, whose resistance is changed depending on the polarity of the charge trap insulator;
a P-type drain region and a P-type source region formed at both sides of the P-type float channel;
a second insulating layer formed on the P-type float channel;
the charge trap insulator formed on the second insulating layer; and
a third insulating layer formed on the charge trap insulator and under the top word line.

10. The charge trap insulator memory device according to claim 9, wherein when high level data are written in the selected memory cell, the first switching element and the second switching element are kept on, a negative voltage is applied to the top word line, and a ground voltage is connected to the bottom word line, the bit line and the sensing line.

11. The charge trap insulator memory device according to claim 10, wherein the top word line of the other memory cells than the selected memory cell is connected to a ground voltage.

12. The charge trap insulator memory device according to claim 10, wherein when high level data stored in the selected memory cell are maintained,
the first switching element is kept on, the second selecting signal becomes a negative voltage so that the second switching element is kept off, a negative voltage is applied to the selected bottom word line, and the top word line and the bit line are kept at a ground voltage level.

13. The charge trap insulator memory device according to claim 12, wherein a negative voltage is connected to the bottom word line of the other memory cells than the selected memory cell.

14. The charge trap insulator memory device according to claim 10, wherein when low level data are written in the selected memory cell,
the first switching element is kept on, the second selecting signal becomes a negative voltage so that the second switching element is kept off, a negative voltage is applied to the selected bottom word line, the top word line is maintained at a ground voltage level, and a negative voltage is applied to the bit line.

15. The charge trap insulator memory device according to claim 14, wherein a negative voltage is connected to the bottom word line of the other memory cells than the selected memory cell.

16. The charge trap insulator memory device according to claim 9, wherein when data stored in the selected memory cell are sensed,
the first switching element and the second switching element are kept on, a ground voltage is connected to the top word line and the sensing line, a read voltage of a high level is applied to the bottom word line connected to the selected memory cell, and a sensing voltage is applied to the bit line.

17. The charge trap insulator memory device according to claim 16, wherein a ground voltage is applied to the bottom word line of the other memory cells other than the selected memory cell.

18. A charge trap insulator memory device comprising:
a plurality of top word lines and a plurality of bottom word lines arranged in parallel to each other and in a row direction;
a plurality of bit lines arranged in a column direction;
a plurality of sensing lines arranged perpendicular to the plurality of bit lines;
a plurality of memory cell arrays arranged where the plurality of top word lines, the plurality of bottom word lines and the plurality of bit lines are crossed; and
a plurality of sense amplifiers, corresponding one by one to the plurality of bit lines, for sensing and amplifying data in the bit line,
wherein each of the plurality of memory cell arrays comprises:
a plurality of serially connected memory cells where data applied through a bit line are stored in a charge trap insulator depending on potentials applied to a top word line and a bottom word line or data stored in the charge trap insulator are outputted to the bit line;
a first switching element for selectively connecting the plurality of memory cells to a bit line in response to a first selecting signal; and
a second switching element for selectively connecting the plurality of memory cells to a sensing line in response to a second selecting signal,
wherein each of the plurality of memory cells comprises:
a first insulating layer formed on the bottom word line;
a P-type float channel, formed on the first insulating layer, whose resistance is changed depending on the polarity of the charge trap insulator;
a P-type drain region and a P-type source region formed at both sides of the P-type float channel;
a second insulating layer formed on the P-type float channel;
the charge trap insulator formed on the second insulating layer; and
a third insulating layer formed on the charge trap insulator and under the top word line.

19. The charge trap insulator memory device according to claim 18, wherein when high level data are written in the selected memory cell,
the first switching element and the second switching element are kept on, a negative voltage is applied to the top word line, and a ground voltage is connected to the bottom word line, the bit line and the sensing line.

20. The charge trap insulator memory device according to 19, wherein a ground voltage is connected to the top word line of the other memory cells than the selected memory cell.

21. The charge trap insulator memory device according to claim 19, wherein when high level data stored in the selected memory cell are maintained,
the first switching element is kept on, the second selecting signal becomes a negative voltage so that the second switching element is kept off, a negative voltage is applied to the selected bottom word line, and the top word line and the bit line are maintained at the ground voltage level.

22. The charge trap insulator memory device according to claim 21, wherein a negative voltage is connected to the bottom word line of the other memory cells than the selected memory cell.

23. The charge trap insulator memory device according to claim 19, wherein low level data are written in the selected memory cell,
the first switching element is kept on, the second selecting signal becomes a negative voltage so that the second switching element is kept off, a negative voltage is applied to the selected bottom word line, the top word line is maintained at the ground voltage level, and a negative voltage is applied to the bit line.

24. The charge trap insulator memory device according to claim 23, wherein a negative voltage is connected to the bottom word line of the other memory cells than the selected memory cell.

25. The charge trap insulator memory device according to claim 18, wherein when data stored in the selected memory cell are sensed,
the first switching element and the second switching element are kept on, a ground voltage is connected to the top word line and the sensing line, a read voltage of a high level is applied to the bottom word line connected to the selected memory cell, and a sensing voltage is applied to the bit line.

26. The charge trap insulator memory device according to claim 25, wherein a ground voltage is connected to the bottom word line of the other memory cells than the selected memory cell.

* * * * *